(12) United States Patent
Beck et al.

(10) Patent No.: US 11,910,523 B2
(45) Date of Patent: Feb. 20, 2024

(54) BUS BAR

(71) Applicant: TDK Electronics AG, Munich (DE)

(72) Inventors: Fabian Beck, Rüttenen (CH); Zilong Kuang, Zhuhai (CN)

(73) Assignee: TDK Electronics AG, Munich (DE)

(*) Notice: Subject to any disclaimer, the term of this patent is extended or adjusted under 35 U.S.C. 154(b) by 157 days.

(21) Appl. No.: 17/236,761

(22) Filed: Apr. 21, 2021

(65) Prior Publication Data

US 2021/0345482 A1 Nov. 4, 2021

(30) Foreign Application Priority Data

Apr. 30, 2020 (DE) .......................... 102020111801.5

(51) Int. Cl.
| | |
|---|---|
| *H05K 1/00* | (2006.01) |
| *H05K 1/02* | (2006.01) |
| *H02M 1/44* | (2007.01) |
| *H03H 1/00* | (2006.01) |

(52) U.S. Cl.
CPC ............ *H05K 1/0233* (2013.01); *H02M 1/44* (2013.01); *H03H 1/0007* (2013.01); *H05K 2201/10272* (2013.01)

(58) Field of Classification Search
CPC ...... H05K 1/0233; H05K 2201/10272; H02M 1/44; H03H 1/0007
See application file for complete search history.

(56) References Cited

U.S. PATENT DOCUMENTS

| | | | |
|---|---|---|---|
| 9,023,508 B2 | 5/2015 | Seong et al. | |
| 9,673,804 B2* | 6/2017 | Hübbers | .............. H05K 7/1432 |
| 9,979,142 B2 | 5/2018 | Gunther | |
| 10,973,090 B2 | 4/2021 | Kanai et al. | |
| 2012/0305283 A1* | 12/2012 | Kalayjian | .......... H01B 13/0036 |
| | | | 174/68.2 |
| 2015/0229071 A1 | 8/2015 | Degen et al. | |
| 2016/0020707 A1 | 1/2016 | Fukumasu et al. | |
| 2017/0186551 A1* | 6/2017 | Matsumoto | ....... H01L 23/49562 |
| 2018/0049314 A1 | 2/2018 | Amaducci et al. | |
| 2018/0198261 A1 | 7/2018 | Wurzinger | |
| 2019/0191550 A1* | 6/2019 | Sasao | ................... H05K 3/3405 |
| 2020/0373254 A1* | 11/2020 | Wang | ..................... H01L 23/50 |

FOREIGN PATENT DOCUMENTS

| | | |
|---|---|---|
| CN | 103210522 A | 7/2013 |
| CN | 107040229 A | 8/2017 |
| CN | 108029161 A | 5/2018 |
| EP | 3696972 A1 | 8/2020 |
| EP | 3761763 A1 | 1/2021 |

* cited by examiner

*Primary Examiner* — Pete T Lee
(74) *Attorney, Agent, or Firm* — Slater Matsil, LLP

(57) ABSTRACT

In an embodiment a bus bar includes a first interface and a second interface, a filter element electrically connected between the first and the second interface and a first rail between the first interface and the second interface, wherein the first rail includes a central section with a metal sheet and a dielectric material at least partially covering the central section.

22 Claims, 3 Drawing Sheets

BUS BAR

CROSS-REFERENCE TO RELATED APPLICATIONS

This application claims priority to German Patent Application No. 102020111801.5, filed on Apr. 30, 2020 which application is hereby incorporated herein by reference.

TECHNICAL FIELD

The present invention refers to improved bus bars, e.g. for EMC filter circuits with improved attenuation level and to the use of a bus bar, e.g. in an electric vehicle.

BACKGROUND

Bus bars can be used to conduct electric power from a power source to an electric motor, e.g., of an electric motor drive.

Electric motor drives can be the source of unwanted emissions that should be reduced or eliminated to avoid unwanted interference with other circuit components. EMC filter elements can be electrically connected, e.g., between a power source and an electric motor drive, to reduce unwanted emissions.

For example, in electrically driven vehicles a battery provides electrical energy to an electric motor drive. The battery provides a DC (direct current) current at a specific voltage. When the electric motor drive needs another form of electrical energy, e.g. AC (alternating current) or another voltage, an inverter can be employed to convert electric energy of a battery such that it can be well utilized by an electric motor drive. However, inverters can also be the source of unwanted emissions. Correspondingly, an EMC filter can be used to reduce or eliminate unwanted emissions from the inverter.

SUMMARY

Embodiments provide a bus bar that allows a reduced noise level at its output side.

A conventional way of transmitting power is the use of a printed circuit board (PCB) with metallized conducting structures on a dielectric material.

Embodiments further provide a low-cost alternative to a PCB.

The bus bar comprises a first interface and a second interface. Further, the bus bar comprises a filter element electrically connected between the first and the second interface. Further, the bus bar comprises a first rail between the first interface and the second interface. The first rail comprises a central section with a metal sheet and a dielectric material at least partially covering the central section.

The filter element can be a filter element of a filter, e.g. of an EMC filter (EMC=Electromagnetic Compatibility).

Thus, a bus bar is provided that allows transferring electrical power from one of the two interfaces to the respective other interface. Further, integration of the bus bar into existing circuit environments is easy because the central section can be used for mounting circuit elements, such as circuit elements of a filter such as one or more of SMD-elements (surface mountable devices) resistors, inductors and/or capacitors. Thus, specifically, the filter element electrically connected between the two interfaces can be mounted at the central section.

PCBs being a conventional means for signal or power transfer with the option of mounting circuit elements have a construction with a dielectric core and metallized structures.

Correspondingly, the bus bar as described above is a counterintuitive device because it has the opposite construction with the first rail comprising a metal sheet and a covering dielectric.

The described bus bar can be produced at reduced costs. Further, the bus bar can contribute to improving electric parameters such as the noise of a system because of the improved flexibility of shaping the metal sheet compared to the stiffness of the dielectric core of conventional PCBs and the low power transfer capabilities of metallizations on a PCB.

Obviously, the provided bus bar is counterintuitive because the intuitive approach would be providing PCBs with thicker metallizations if transferable power were to be increased.

It is possible that the first and the second interface are arranged at opposite distal ends of the bus bar and the central section is arranged between the first and the second interface.

Specifically, it is possible that the central section has a flat upper surface.

Thus, the mounting of circuit elements on the flat surface provides a dense stacking—in a vertical or horizontal direction—of the circuit elements.

Thus, integration density can be improved.

Further, the shape of the sheet can be chosen such that paths to ground can be as short as possible, improving electrical properties and the performance of the system with the bus bar included.

It is possible that the bus bar further comprises one or more additional rails.

The rails can be arranged vertically and/or horizontally next to one another, allowing a compact size. Each rail at an upper position can have a flat area usable for mounting electrical elements.

It is possible that the first interface and/or the second interface comprise(s) a mechanical connection.

The mechanical connection can be provided and configured for mechanically connecting the component to an external mounting location. The mechanical connection can also be provided and configured for electrically connecting the filter circuit to a ground potential of the external mounting location with the shortest possible path.

In the bus bar the first interface can comprise the electrical connections to an electrical component from which an EMC filter obtains electric energy. The second interface can comprise electrical connections via which the EMC filter component provides electric power to an external circuit environment. Specifically, the first interface can be provided and configured for connecting the bus bar with a battery. The second interface can be used to electrically connect the bus bar to an electric motor drive, e.g. of an electric vehicle or to an inverter thereof. Then, the filter element reduces noise originating from the inverter at the site of the battery.

The filter circuitry of the EMC filter component can comprise filter elements such as active or passive filter elements like inductance elements, resistance elements and/or capacitance elements that build a filter network. Conventional filter network topologies are possible for the present EMC filter component. The external mounting location is arranged within the direct vicinity of the bus bar. The mechanical connection can be used to mount the circuitry in a mechanically stable configuration such that vibrations or inertial forces cannot reposition the circuit elements attached or mounted to the bus bar. The external mounting location can be a mounting location of a further electrical component in the vicinity of the bus bar. Specifically, it is possible that the external mounting location is a mounting location at an electrical component to which the EMC filter component is directly connected, for example, a battery, an inverter or an electric motor drive.

It is possible that the circuitry further comprises a DC-Link capacitor as a circuit element.

It is possible that the external mounting location is a mounting location of a component, e.g. a semiconductor component, e.g. an inverter, providing a ground potential to the circuitry, e.g. an EMC filter component.

Thus, the mechanical connection is a dual purpose connection providing a mechanically stable connection and an electrical connection to a ground potential with a short effective conductor length.

It is possible that the mechanical connection and/or the one or more metal sheets comprise(s) or consist(s) of a material selected from a metal and an alloy.

Specifically, the electrically conducting material can comprise or consist of copper, aluminum, silver, gold or an alloy thereof.

It is possible that the mechanical connection has an elongated shape that has an extension directed away from the component.

In order to provide an electrical and a mechanically stable connection to the environment of the bus bar, the elongated shape and the extension directed away from the bus bar ensures the shortest possible connection to the external mounting location.

It is possible that the elongated shape has a section along the extension direction with a uniform cross section.

It is possible that the elongated shape has a cross section that can be selected from a quadratic cross section, a rectangular cross section, a circular cross section and an elliptical cross section or other shapes, e.g. an L-shape, that provide the possibility for mechanical and electrical connection.

Further, it is possible that the mechanical connection has a distal end that comprises a flat section, where the flat section has a hole.

In this respect the distal end of the mechanical connection is the end of the mechanical connection opposed to the end that directly attaches the connection to the other elements of the EMC filter component.

The provision of a flat section of the mechanical connection ensures that a large contact area to a corresponding connection end of the external mounting location is provided.

The provision of a hole in the flat section ensures that—utilizing a bolt and nuts, for example—a mechanically stable connection can be established.

It is possible that the mechanical connection comprises one, two, three or more pieces.

Each piece of the mechanical connection provides a separate mechanically stable connection and an electrical connection with a short effective conductor length. Each of the pieces can have a similar construction, e.g. with an elongated shape pointing away from the body of the filter component and comprising a flat distal end section with a hole.

It is possible that all pieces of the mechanical connection—at least associated with one of the two interfaces—are arranged at the same side of the component.

This ensures short conductor lengths and mechanically stable connections.

Further, it is possible that pure electrical connections are arranged—at least in a horizontal plane between pieces of the mechanical connection—between two of the pieces of the mechanical connection.

It is possible that the first interface is provided and configured for an electrical connection to a component selected from a further electrical component, a semiconductor component, an inverter, a battery, an electric motor drive.

It is possible that the first interface comprises one, two, three or more connections for establishing a connection to a first potential and one, two, three or more connections to be connected to a second potential. It is possible that the first potential and the second potential are different from a ground potential.

Similarly, it is possible that the second interface is provided and configured for an electrical connection to a component selected from a further electrical component, a semiconductor component, an inverter, a battery, an electrical motor drive.

In this respect, the electric motor can also be thought of as an electric generator.

It is possible that the EMC filter component further comprises a second mechanical connection at the side of the second interface. Similarly to the above description, the second mechanical connection can be provided and configured for mechanically connecting the component to a second external mounting location. The second mechanical connection can also be provided and configured for electrically connecting the filter component to a ground potential of the second external mounting location.

Thus, it is possible that the second interface comprises one, two, three or more connections for a first potential; one, two, three or more connections for a second potential; and one, two, three or more connections for a ground potential.

In this respect the electrical connections can be connections of the first and/or the second interface, respectively.

It is further possible that a filter circuit associated with the bus bar comprises resistance elements, capacitance elements and inductance elements as circuit elements.

It is possible that two inductance elements of the filter circuit are magnetically coupled.

In a first embodiment of the bus bar, the bus bar comprises rails, i.e. two power lines.

Further, the first interface comprises a first piece and a second piece of the mechanical connection. Further, each of the two mechanical connections of the first interface is electrically coupled to one of the two rails of the bus bar.

Further, at the second interface the bus bar can have a first connection electrically connected to the first rail and a second connection electrically connected to a second rail.

A DC-Link EMC system can comprise an EMC filter component as described above and a semiconductor component as described below. The EMC filter component and the semiconductor component can be electrically and mechanically connected to one another via their mechanical connections.

The semiconductor component opens up a possibility of connecting the further electrical component electrically and mechanically to the EMC filter component. The semiconductor component can also comprise a first interface, a second interface and a semiconductor circuit together with a mechanical connection. The semiconductor circuit is electrically connected between the first interface and the second interface. The mechanical connection is provided and configured for mechanically connecting the component to an external mounting location, e.g. of the EMC filter component. The mechanical connection is also provided and configured for electrically connecting the semiconductor circuit to a mechanical connection of an EMC filter component.

It is possible that the semiconductor component is an inverter. Thus, the semiconductor circuit of the semiconductor component comprises the corresponding semiconductor switches and further circuitry needed for establishing the inverter function, e.g. for converting electric energy provided by a battery to electric energy needed by an electric motor drive.

It is possible that the bus bar further comprises one or more dielectric layers between conducting rails and/or one or more conducting rails between dielectric layers.

It is possible that the bus bar further comprises one or more rails electrically connected to a ground potential.

The provision of a ground potential allows shortening the ground path for circuit elements, improving electrical properties.

The provision of more than one ground potentials allows providing separate ground potentials to critical circuit elements, improving electrical properties.

It is possible that one or more rails have a section along a vertical or ascending or descending direction.

Such sections allow a specific adaption to an already existing three-dimensional arrangement of connections of the external circuit environment. The specific use of metal sheets effectively simplifies shaping the bus bar, in particular compared to PCBs.

It is possible to use the bus bar in a system selected from an electrical system and the electrical system of a vehicle.

Specifically, it is possible to use the corresponding components or the system of components between a battery and an electric motor drive.

The bus bar can be used for high power applications and for high current applications such as high current inverter applications.

BRIEF DESCRIPTION OF THE DRAWINGS

Central working principles and details of preferred embodiments are shown in the accompanying schematic figures.

DETAILED DESCRIPTION OF ILLUSTRATIVE EMBODIMENTS

Figure 1:
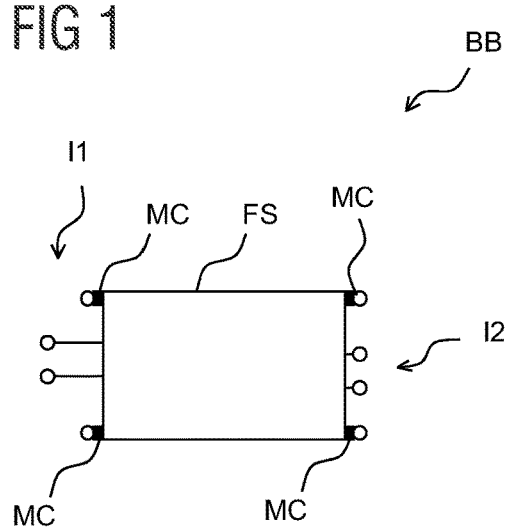
FIG. 1 shows a basic version of the bus bar in a top view.

FIG. 1 illustrates basic elements of the bus bar BB. The bus bar BB comprises a first interface I1 and a second interface I2. At the side of the first interface I1 and second interface I2 mechanical connections MC are arranged. The mechanical connections MC are created with a mechanical strength sufficient for solidly mounting the bus bar BB to external mounting locations. In addition, the mechanical connections MC further provide an electric functionality because the mechanical connections MC are provided and configured for electrically connecting the bus bar BB to an external mounting location of an external circuit environment.

In FIG. 1 the first interface I1 and the second interface I2, thus, comprise two dual purpose mechanical connections MC for mechanically and electrically connecting the component EFC to an external circuit environment. Further, pure electrical connection means or pure mechanical connection means are also possible.

Figure 2:
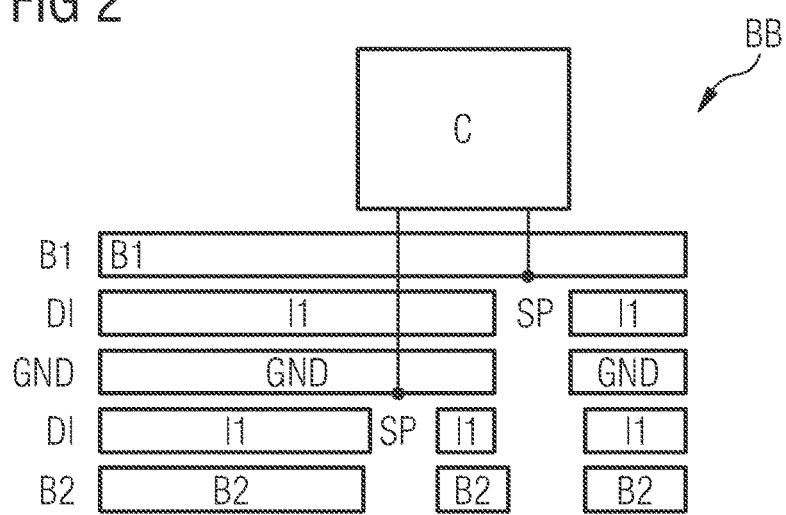
FIG. 2 shows a possible conductor configuration of the bus bar.

FIG. 2 shows a possible conductor configuration of the bus bar. B1 and B2 denote a first and a second rail for conducting power. DI denotes dielectric layers insulating conducting layers against one another. GND denotes a conducting rail connected to a ground potential. A capacitor is attached to the bus bar and connected to the second rail B2 and to ground. To that end, holes are arranged in the rail B2 and in the GND layer and in the dielectric layers, respectively.

Figure 3:
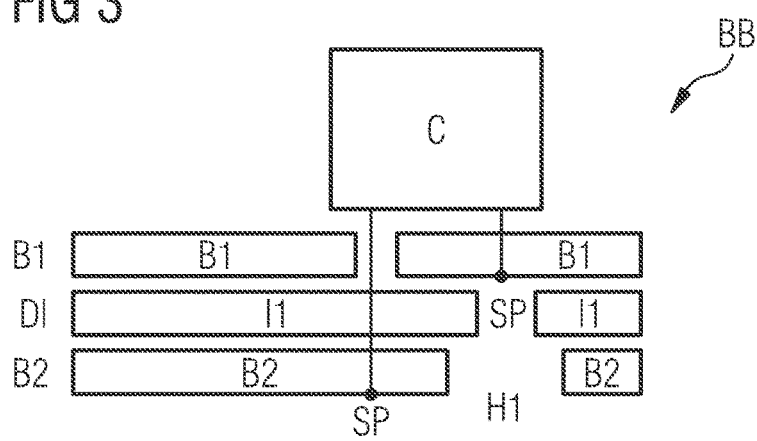
FIG. 3 shows a possible alternative conductor configuration of the bus bar.

Similarly, FIG. 3 shows a possible configuration with one dielectric layer separating the first rail B1 from the second rail B2. Holes in the respective layers allow contacting the capacitor C.

Figure 4:
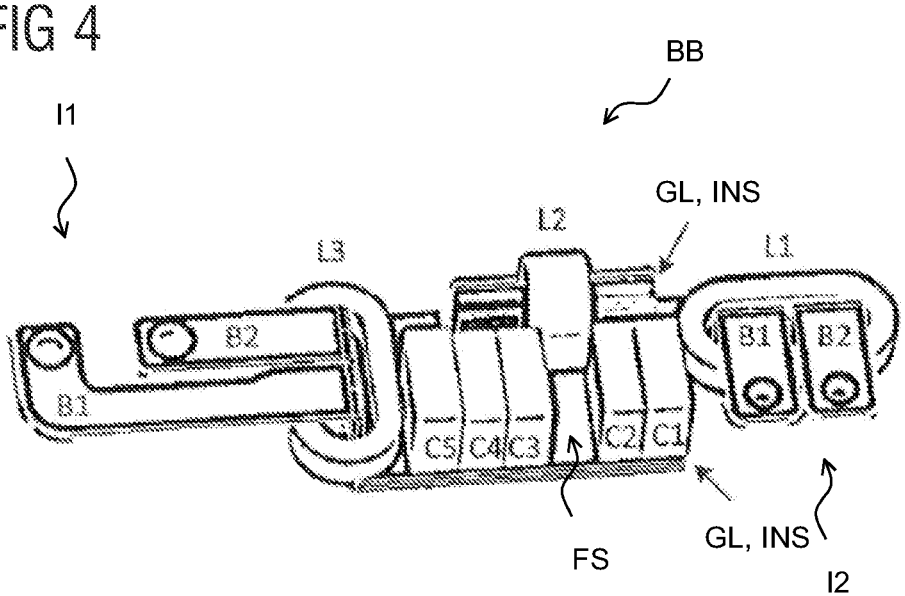
FIG. 4 shows a perspective view of a possible bus bar with additional circuit elements attached.

FIG. 4 shows a bus bar BB in a perspective view, illustrating only one of a plurality of possible ways of shaping the elements of the bus bar—basing on a metal sheet—to provide a good three-dimensional and high density integration of the bus bar into an existing circuit environment.

The bus bar has its interfaces I1, I2 at distal ends and a flat surface provided there between. On the flat surface, circuit elements such as capacitance elements of an EMC circuit are arranged on and attached to the flat upper surface.

Both the first and the second interface comprise rod-shaped extended conductor segments extending in a horizontal and in a vertical direction. This flexibility in shaping the interfaces' conductors is obtained by using bendable metal sheet. At the vertical segments, inductance elements L1, L3 are arranged and magnetically coupled with the interfaces' conducting segments.

Further, the rails arranged below the flat upper surface contain ground layers GL and separating insulating dielectric layers INS.

In the view of FIG. RE 4, behind the capacitance elements C1 to C5 on the flat upper surface a further inductance element L2 is arranged.

Figure 5:
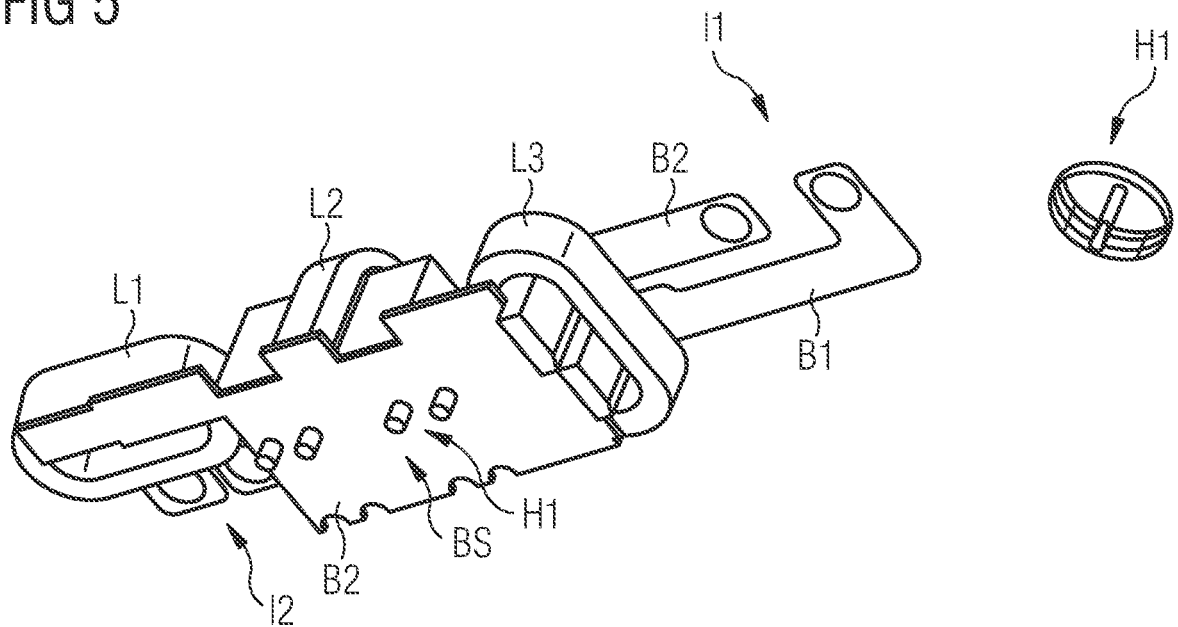
FIG. 5 shows a perspective view of the bus bar of FIG. 4 from another position.

FIG. 5 shows the configuration of FIG. 4 from a bottom perspective illustrating the flat bottom surface of the bus bar. The bottom surface shows four holes. An enlarged picture of the first hole H1 is shown on the right side of FIG. 4. The holes can be used for accessing power conductors or ground conductors of the bus bar or other circuit elements of the external circuit environment arranged below the bus bar.

Also, it is possible to attach and connect circuit elements at the flat bottom surface BS of the bus bar.

The distal ends of the connections comprise holes which are easy to manufacture, e.g. by punching holes in the sheets, and which can be used to electrically and mechanically connect the bus bar to the corresponding external circuit environment.

Figure 6:
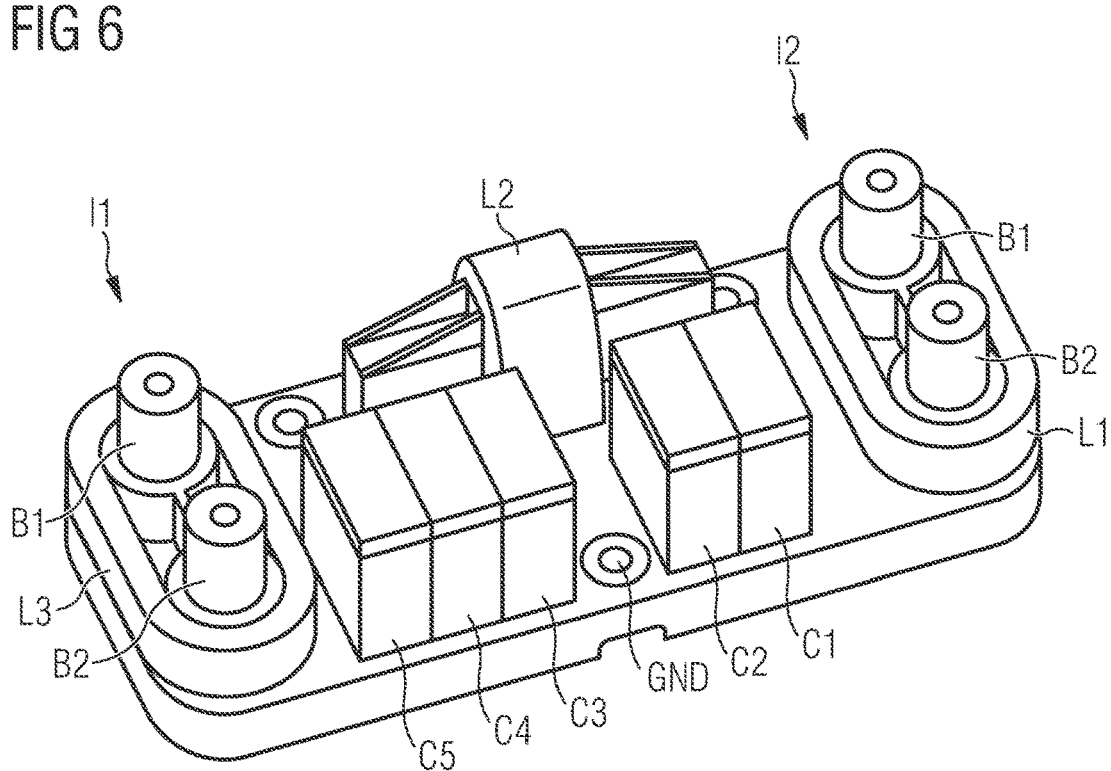
FIG. 6 shows a perspective view of a possible alternative bus bar with additional circuit elements attached.

FIG. 6 shows an alternative configuration of the bus bar. Again, circuit elements C1, C2, C3, C4, C5 and L2 are arranged at a flat upper surface on the bus bar between the connections of the first interface I1 and the second interface I2.

Also, two conductance elements L1, L3 are attached to and magnetically coupled to the interfaces I1, I2.

However, the interfaces' connections comprise cylindrical segments extending in the vertical direction.

Figure 7:
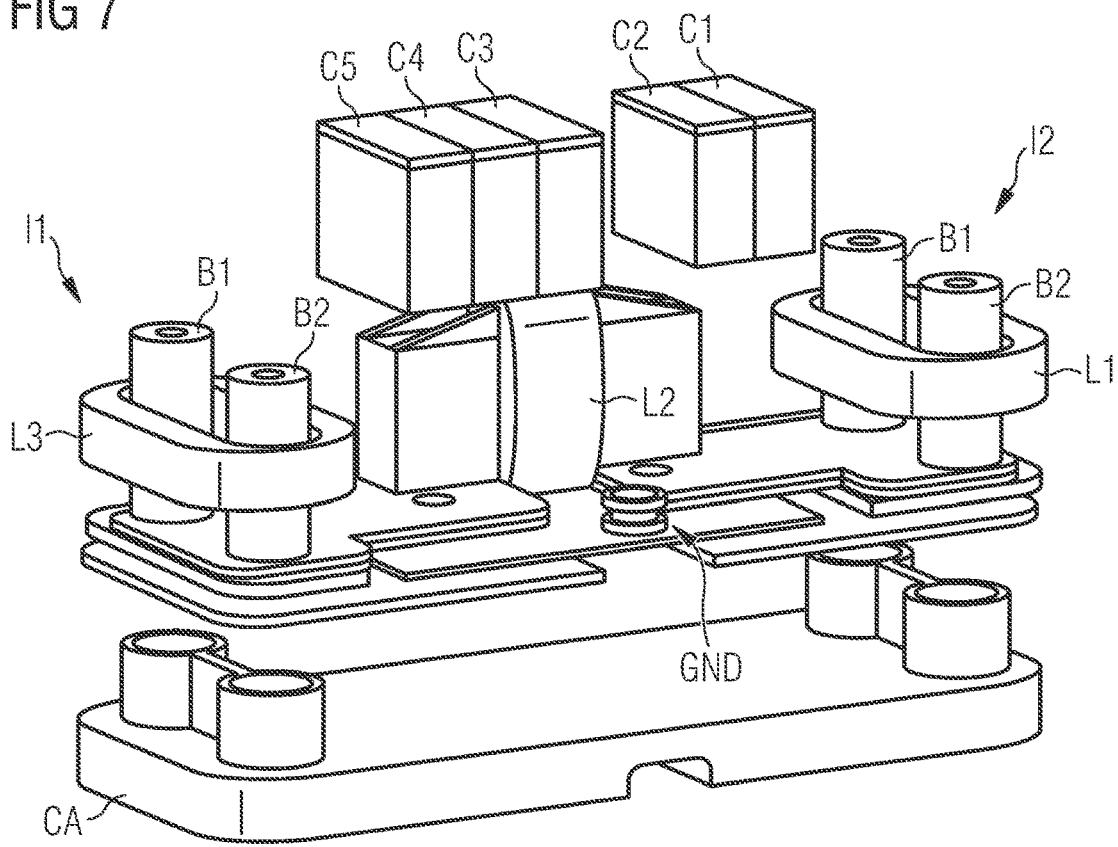
FIG. 7 shows an exploded view of the bus bar of FIG. 6 from another position.

FIG. 7 shows an exploded view of the configuration of the bus bar of FIG. 6 further showing a carrier CA on which the rails are arranged.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A bus bar comprising:
a first interface and a second interface;
a filter element electrically connected between the first and the second interface;
a first rail and a second rail between the first interface and the second interface,
wherein each of the first and second rails comprises a central section with a bendable metal sheet,
wherein the metal sheets are arranged as layers in the central section, and
wherein at least one dielectric layer separates the first rail from the second rail in the central section; and
a further rail electrically connected to a ground potential, the further rail being located between the first and second rails.

2. The bus bar according to claim 1, wherein the first and the second interface are arranged at opposite distal ends of the bus bar and the central section is arranged between the first and the second interface.

3. The bus bar according to claim 1, wherein the first interface and/or the second interface comprise(s) a mechanical connection.

4. The bus bar according to claim 3, wherein the mechanical connection is configured to:
mechanically connect the bus bar to an external mounting location; and
electrically connect the bus bar to the external mounting location.

5. The bus bar according to claim 3, wherein the mechanical connection has an elongated shape that has an extension directed away from the bus bar.

6. The bus bar according to claim 5, wherein the elongated shape has a section along an extension direction with a uniform cross section.

7. The bus bar according to claim 5, wherein the elongated shape has a cross section selected from a quadratic cross section, a rectangular cross section, a circular cross section, or an elliptical cross section.

8. The bus bar according to claim 3, wherein the mechanical connection has a distal end that comprises a flat section with a hole.

9. The bus bar according to claim 3, wherein the mechanical connection comprises two, three or more pieces.

10. The bus bar according to claim 9, wherein all pieces of the mechanical connection are arranged at the same side of the bus bar.

11. The bus bar according to claim 1, further comprising a DC-Link capacitor as a circuit element.

12. The bus bar according to claim 1, wherein the first interface is configured to electrically connect to a component selected from a further electrical component, a semiconductor component, an inverter, a battery or an electric motor drive.

13. The bus bar according to claim 1, wherein the first interface comprises one, two, three or more connections to be connected to a first potential and one, two, three or more connections for connection to a second potential.

14. The bus bar according to claim 1, wherein the second interface is configured to electrically connect to a component selected from a further electrical component, a semiconductor component, an inverter, a battery, or an electric motor drive.

15. The bus bar according to claim 1, further comprising a second mechanical connection at a side of the second interface, wherein the second mechanical connection is configured to mechanically connect the bus bar to a second external mounting location and to electrically connect the filter element to a ground potential of the second external mounting location.

16. The bus bar according to claim 1, wherein the second interface comprises one, two, three or more connections for a first potential, one, two, three or more connections for a second potential, one, two, three or more connections for a ground potential.

17. The bus bar according to claim 1, wherein the filter element comprises resistance elements, capacitance elements and inductance elements.

18. The bus bar according to claim 1, wherein the first and second rails have a section along a vertical or ascending or descending direction.

19. A system comprising:
a battery;
an electrical motor drive; and
the bus bar according to claim 1,
wherein the bus bar is connected between the battery and the electrical motor drive, and
wherein system is an electrical system of a vehicle.

20. A bus bar comprising:
a first interface and a second interface;
a filter element electrically connected between the first and the second interface;
a first rail and a second rail between the first interface and the second interface,
wherein each of the first and second rails comprises a central section with a bendable metal sheet, and
wherein the metal sheets are arranged as layers in the central section; and
at least one dielectric layer separating the first rail from the second rail in the central section,
wherein the first interface comprises an extended portion of the bendable metal sheet of the first rail and an extended portion of the bendable metal sheet of the second rail, and
wherein the second interface comprises an extended portion of the bendable metal sheet of the first rail and an extended portion of the bendable metal sheet of the second rail.

21. The bus bar of claim 20, further comprising an inductive element, wherein the extended portions of the bendable metal sheets are guided through the inductive element.

22. The bus bar of claim 20, wherein the extended portions are arranged side by side at each of the interfaces.

\* \* \* \* \*